US011678406B2

(12) United States Patent
Funabiki et al.

(10) Patent No.: US 11,678,406 B2
(45) Date of Patent: Jun. 13, 2023

(54) FLUID CONTROL APPARATUS

(71) Applicant: FUJIKIN INCORPORATED, Osaka (JP)

(72) Inventors: Teruyuki Funabiki, Osaka (JP); Ryuhei Takasawa, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 314 days.

(21) Appl. No.: 16/913,337

(22) Filed: Jun. 26, 2020

(65) Prior Publication Data

US 2020/0413494 A1 Dec. 31, 2020

(30) Foreign Application Priority Data

Jun. 27, 2019 (JP) ............................. JP2019-120135

(51) Int. Cl.
*H05B 1/02* (2006.01)
*F24H 1/00* (2022.01)
(Continued)

(52) U.S. Cl.
CPC ........ *H05B 1/0233* (2013.01); *F15B 13/0803* (2013.01); *F16L 53/30* (2018.01);
(Continued)

(58) Field of Classification Search
CPC .............. F15B 13/0803; F15B 15/1485; F15B 2211/62; F16L 53/30; F24H 1/0018; H01L 21/67017; H05B 1/0233
(Continued)

(56) References Cited

U.S. PATENT DOCUMENTS

| 6,648,020 | B2* | 11/2003 | Fujimoto | ............... F16K 27/003 137/884 |
| 7,320,339 | B2* | 1/2008 | Milburn | .................... F17D 1/04 137/884 |
| 2004/0129324 | A1* | 7/2004 | Vu | ........................ F16K 27/003 137/884 |

FOREIGN PATENT DOCUMENTS

| JP | 2015206464 A | 11/2015 |
| KR | 20120001915 U | * 3/2012 |
| WO | WO-2019059043 A1 | * 3/2019 ....... C23C 16/45544 |

OTHER PUBLICATIONS

Translation of WO-2019059043-A1 (Year: 2019).*
Translation of KR 20120001915 U (Year: 2012).*

* cited by examiner

*Primary Examiner* — Steven B McAllister
*Assistant Examiner* — Benjamin W Johnson
(74) *Attorney, Agent, or Firm* — Cantor Colburn LLP

(57) ABSTRACT

A fluid control apparatus includes: a metal plate; a heater configured to heat the metal plate; a first joint block and a second joint block provided on an installation surface of the metal plate, extending in a predetermined direction, and formed with a flow passage therein; a first pipe extending along the predetermined direction between the first joint block and the second joint block; a heat transfer cover provided on the installation surface of the metal plate; and a first fluid control device mounted to the first joint block and the second joint block so as to straddle over the first pipe. The heat transfer cover has a rectangular cross-sectional shape, extends along the predetermined direction, and includes a first cover member and a second cover member mounted around an outer circumference of the first pipe in contact with each other. The first cover member covers a part in a cross section of the first pipe and has a first abutment surface abutting on the installation surface of the metal plate.

(Continued)

The second cover member covers another part in a cross section of the first pipe and has a second abutment surface abutting on the first fluid control device.

4 Claims, 6 Drawing Sheets

(51) Int. Cl.
*F15B 13/08* (2006.01)
*F16L 53/30* (2018.01)
H01L 21/67 (2006.01)
F15B 15/14 (2006.01)

(52) U.S. Cl.
CPC ........ *F24H 1/0018* (2013.01); *F15B 15/1485* (2013.01); *F15B 2211/62* (2013.01); *H01L 21/67017* (2013.01)

(58) Field of Classification Search
USPC ........................................... 392/480
See application file for complete search history.

FLUID CONTROL APPARATUS

CROSS REFERENCE TO RELATED APPLICATION

This present invention claims priority under 35 U.S.C. § 119 to Japanese Patent Application No. 2019-120135 filed Jun. 27, 2019, the entire content of which is incorporated herein by reference.

TECHNICAL FIELD

The present disclosure relates to a fluid control apparatus.

BACKGROUND

A cover mounted to a pipe in which a fluid flows is proposed in Japanese Patent Application Publication No. 2015-206464. This cover is a splittable cover that is a cylindrical shape when split parts are united.

SUMMARY

However, since the cover of Japanese Patent Application Publication No. 2015-206464 is cylindrical shape, the heat from a heater cannot be transferred to the pipe and fluid control device in cases where the fluid control apparatus uses this cover for the purpose of transferring the heat from the heater to the pipe and fluid control device.

Accordingly, an object of the present disclosure is to provide a fluid control apparatus capable of reliably transferring heat from a heater to a pipe and a fluid control device.

A fluid control apparatus according to one embodiment of the present disclosure includes: a metal plate; a heater configured to heat the metal plate; a first joint block and a second joint block provided on an installation surface of the metal plate, extending in a predetermined direction, and formed with a flow passage therein; a first pipe extending along the predetermined direction between the first joint block and the second joint block; a heat transfer cover provided on the installation surface of the metal plate; and a first fluid control device mounted to the first joint block and the second joint block so as to straddle over the first pipe. The heat transfer cover has a rectangular cross-sectional shape, extends along the predetermined direction, and includes a first cover member and a second cover member mounted around an outer circumference of the first pipe in contact with each other. The first cover member covers a part in a cross section of the first pipe and has a first abutment surface abutting on the installation surface of the metal plate. The second cover member covers another part in a cross section of the first pipe and has a second abutment surface abutting on the first fluid control device.

DETAILED DESCRIPTION

A fluid control apparatus 1 according to one embodiment of the present disclosure will be described with reference to the drawings.

Figure 1:
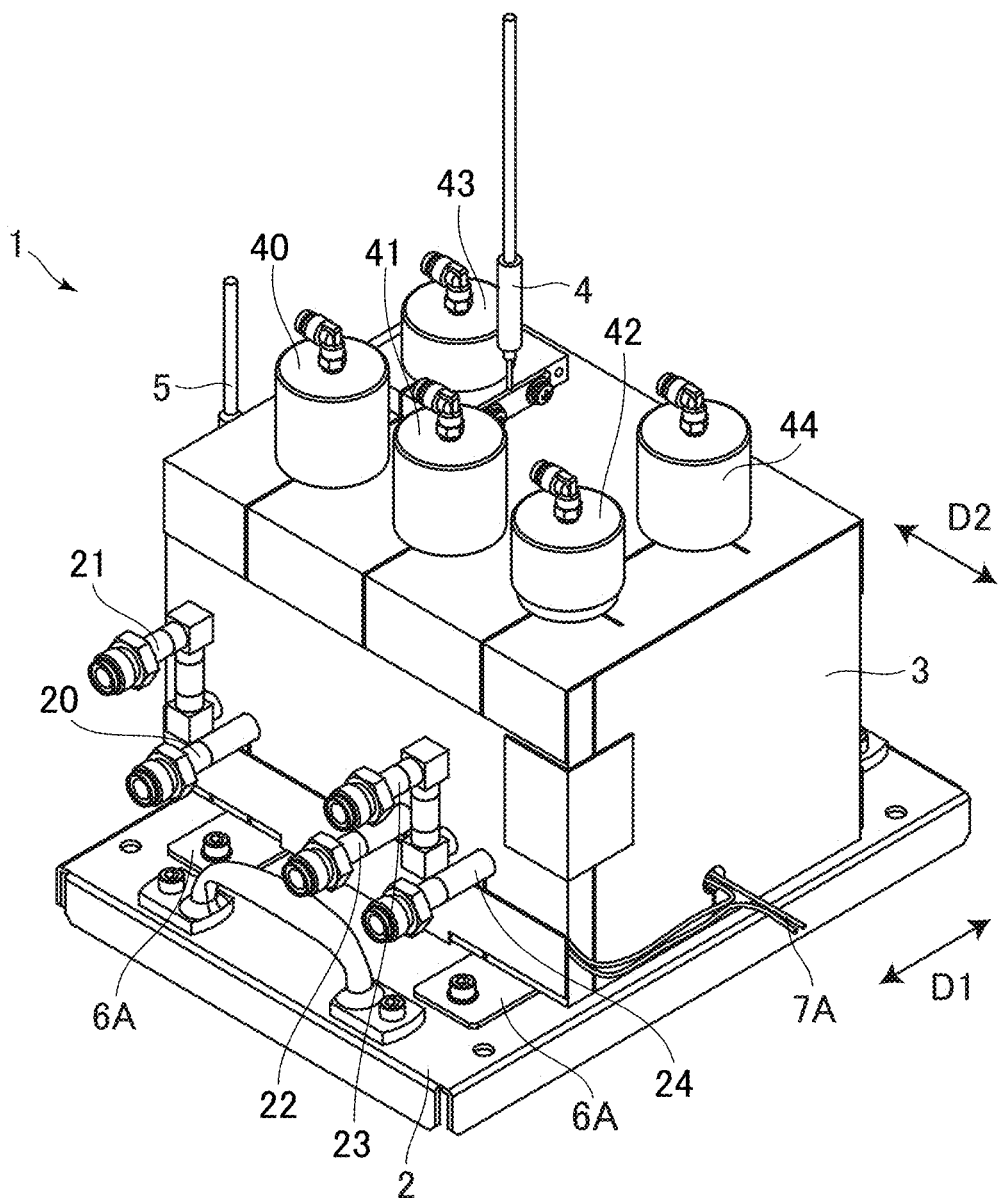
FIG. 1 is a perspective view of a fluid control apparatus according to one embodiment.

FIG. 1 is a perspective view of the fluid control apparatus 1 according to this embodiment.

Figure 2:
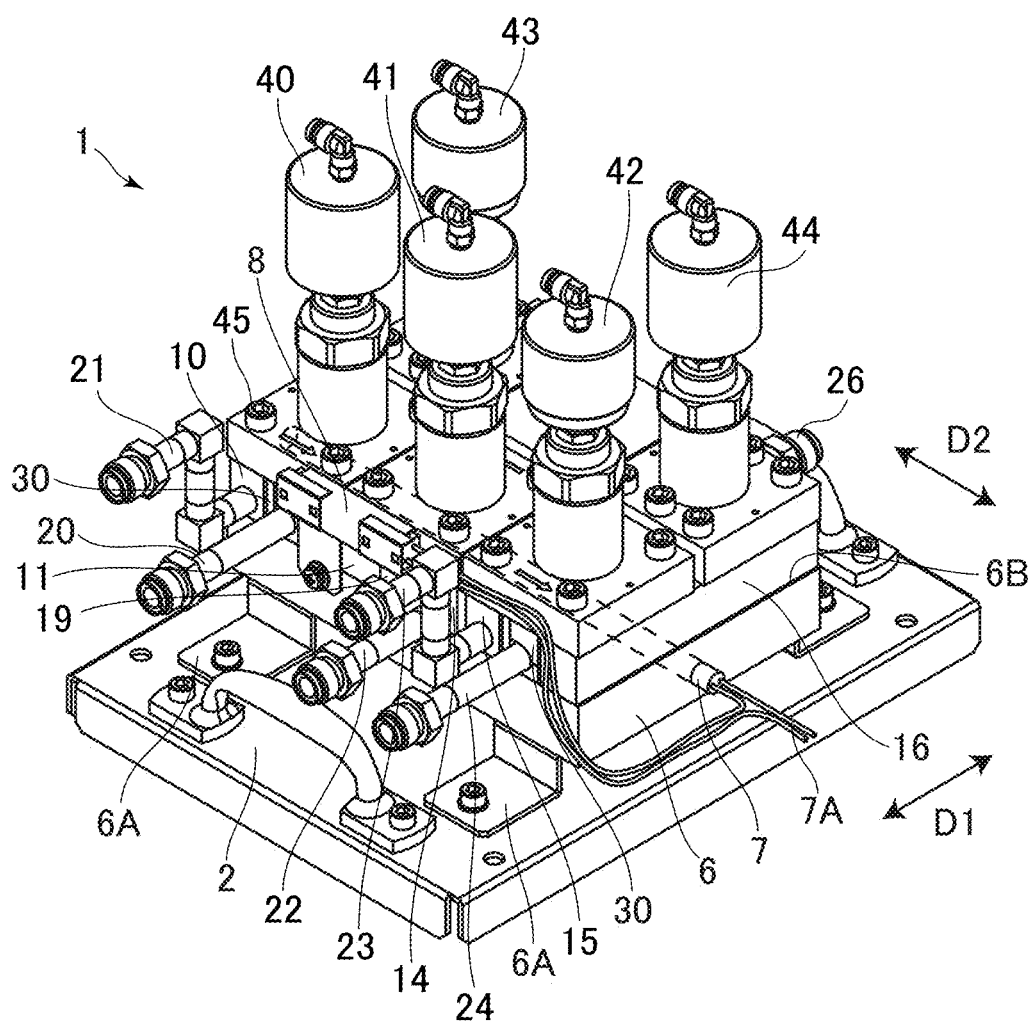
FIG. 2 is a perspective view of the fluid control apparatus from which the cover has been removed.

FIG. 2 is a perspective view of the fluid control apparatus 1 from which a cover 3 has been removed.

Figure 3:
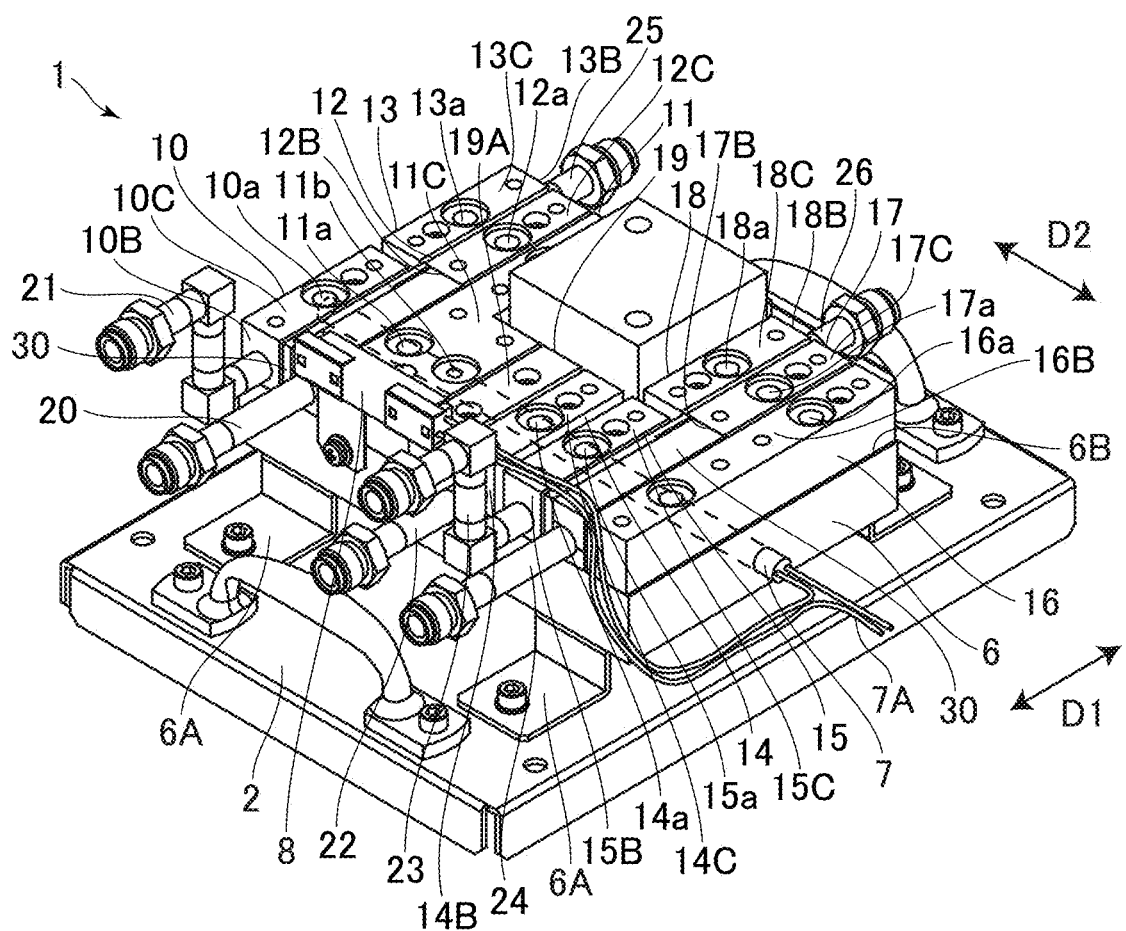
FIG. 3 is a perspective view of the fluid control apparatus 1 from which the cover and a plurality of fluid control devices have been removed.

FIG. 3 is a perspective view of the fluid control apparatus 1 from which the cover 3 and a plurality of fluid control devices 40 to 44 have been removed.

In FIG. 1 to FIG. 3, the lower left side is the primary side, and the upper right side is the secondary side. "Up" and "down" in the following description shall refer to an up and down direction in FIG. 1 to FIG. 3. A direction in which a fluid moves from the primary side to the secondary side in the fluid control apparatus 1 will be referred to as "first direction D1", and a direction parallel to an installation surface 6B and orthogonal to the first direction D1 will be referred to as "second direction D2".

As illustrated in FIG. 1 to FIG. 3, the fluid control apparatus 1 includes a base plate 2, a cover 3, a plurality of thermocouples 4 and 5, a metal plate 6, a cartridge heater 7, a thermostat 8, a plurality of joint blocks 10 to 18, a heat transfer block 19, a plurality of pipes 20 to 26, a plurality of heat transfer covers 30, 30 and a plurality of fluid control devices 40 to 44.

The base plate 2 is made of a metal material such as stainless steel and in the shape of a flat box open on one side.

The cover 3 is mounted to the base plate 2 such as to cover the metal plate 6, cartridge heater 7, the plurality of joint blocks 10 to 18, a part of the plurality of pipes 20 to 26, the plurality of heat transfer covers 30, 30, and a part of the plurality of fluid control devices 40 to 44. The cover 3 is provided to maintain the temperature of the plurality of joint blocks 10 to 18 and the plurality of fluid control devices 40 to 44 at a predetermined level.

The thermocouples 4 and 5 are respectively fixed to a bracket mounted to a three-way valve 43 and the metal plate 6 for measuring the temperature of the flow passage and the metal plate 6. The distal end of the thermocouple 4 is inserted into the body of the three-way valve 43, and the distal end of the thermocouple 5 is inserted into the metal plate 6.

The metal plate 6 is made of aluminum alloy, for example, has a flat plate shape, and is mounted to the base plate 2 with mounting fixtures 6A. The metal plate 6 has an installation surface 6B.

The cartridge heater 7 is inserted into the metal plate 6, and has a power supply cable 7A connected thereto. The cartridge heater 7 heats the metal plate 6 to a temperature of 100° C. to 250° C., for example.

The thermostat 8 is mounted to the metal plate 6 and controls the cartridge heater 7 so that the temperature of the plurality of fluid control devices 40 to 44 does not exceed a predetermined level.

As illustrated in FIG. 2 and FIG. 3, the plurality of joint blocks 10 to 18 include a first to ninth joint blocks 10 to 18.

The first joint block 10 is fixed to the primary side on the installation surface 6B of the metal plate 6 with bolts (not shown). The first joint block 10 is substantially rectangular in cross section and extends along the first direction D1 that is a predetermined direction. A substantially L-shaped flow passage 10a is formed in the first joint block 10. One end of the flow passage 10a opens in a side face 10B at one end in the first direction D1 of the first joint block 10. The other end of the flow passage 10a opens in an upper face 10C on the opposite side from the installation surface 6B of the first joint block 10.

The third to sixth, eighth, and ninth joint blocks 12 to 15, 17, and 18 are in the same shape as the first joint block 10. Thus flow passages 12a to 15a, 17a, and 18a that open in side faces 12B to 15B, 17B, and 18B and upper faces 12C to 15C, 17C, and 18C are formed in the third to sixth, eighth, and ninth joint blocks 12 to 15, 17, and 18. The third, fifth, sixth, and eighth joint blocks 12, 14, 15, and 17 are fixed to the installation surface 6B in the same direction as the direction in which the first joint block 10 is fixed along the first direction D1. The fourth and ninth joint blocks 13 and 18 are fixed to the installation surface 6B in the opposite direction from the direction in which the first joint block 10 is fixed along the first direction D1.

The second joint block 11 is spaced from the first joint block 10 in the second direction D2 and fixed to the installation surface 6B. The second joint block 11 is substantially L-shaped in plan view and has a length along the longitudinal direction thereof (first direction D1) that is about twice larger than the length in the first direction D1 of the first joint block 10. A part on the primary side of the second joint block 11 has a width that is about twice larger than the width in the second direction D2 of the first joint block 10. The second joint block 11 has the same width in the second direction D2 as that of the first joint block 10 in a part on the secondary side. Two flow passages 11a and 11b are formed in the second joint block 11. One flow passage 11a is formed along the first direction D1, with both ends open in the upper face 11C. The other flow passage 11b is formed along the second direction D2, with both ends open in the upper face 11C. Since the flow passages 11a and 11b share one opening, the flow passages 11a and 11b open in the upper face 11C at three points.

The third joint block 12 adjoins the second joint block 11 in the second direction D2 and is fixed to the secondary side on the installation surface 6B of the metal plate 6.

The fourth joint block 13 is positioned on the secondary side of the first joint block 10 adjacent the third joint block 12 in the second direction D2 and is fixed to the installation surface 6B of the metal plate 6.

The fifth joint block 14 is spaced from the second joint block 11 in the second direction D2 and is fixed to the primary side on the installation surface 6B of the metal plate 6.

The sixth joint block 15 adjoins the fifth joint block 14 in the second direction D2 and is fixed to the installation surface 6B of the metal plate 6.

The seventh joint block 16 is spaced from the sixth joint block 15 in the second direction D2 and is fixed to the installation surface 6B of the metal plate 6. The seventh joint block 16 has a length along the longitudinal direction thereof (first direction D1) that is about twice larger than the length in the first direction D1 of the first joint block 10. The seventh joint block 16 has the same width in the second direction D2 as the width in the second direction D2 of the first joint block 10. A flow passage 16a is formed along the first direction D1 in the seventh joint block 16, with both ends thereof open in an upper face 16B.

The eighth joint block 17 adjoins the seventh joint block 16 in the second direction D2 and is fixed to the secondary side on the installation surface 6B of the metal plate 6.

The ninth joint block 18 is positioned on the secondary side of the sixth joint block 15 adjacent the eighth joint block 17 in the second direction D2 and is fixed to the installation surface 6B of the metal plate 6.

The heat transfer block 19 is positioned between the fifth joint block 14 and the second joint block 11 and fixed to the installation surface 6B of the metal plate 6.

The openings on the primary side of the flow passages 10a to 18a and 11b of the first to ninth joint blocks 10 to 18 are aligned substantially along a line in the second direction D2, and the openings on the secondary side are aligned substantially along a line in the second direction D2. The upper faces 10C to 15C, 16B, 17C, and 18C of the first to ninth joint blocks 10 to 18 are flush with the upper face 19A of the heat transfer block 19.

The plurality of pipes 20 to 26 include a first to seventh pipes 20 to 26. The first to fifth pipes 20 to 24 are positioned on the primary side and function as inlet pipes. The sixth and seventh pipes 25 and 26 are positioned on the secondary side and function as outlet pipes.

The first pipe 20 extends along the first direction D1 between the first joint block 10 and the second joint block 11 and is connected to the third joint block 12. The second joint block 11 extends along a part of the first pipe 20 on the metal plate 6 and along the third joint block 12.

The second pipe 21 is substantially Z-shaped and connected to the first joint block 10. The third pipe 22 is connected to the fifth joint block 14. The fourth pipe 23 is substantially Z-shaped and connected to the sixth joint block 15.

The fifth pipe 24 extends along the first direction D1 between the sixth joint block 15 and the seventh joint block 16 and is connected to the eighth joint block 17.

The sixth pipe 25 is connected to the fourth joint block 13. The seventh pipe 26 is connected to the ninth joint block 18.

The plurality of heat transfer covers 30, 30 are fixed to the installation surface 6B of the metal plate 6. One heat transfer cover 30 covers the outer circumference of a part of the first pipe 20 positioned on the installation surface 6B of the metal plate 6. The other heat transfer cover 30 covers the outer circumference of a part of the fifth pipe 24 positioned on the installation surface 6B of the metal plate 6. The configuration of the heat transfer covers 30, 30 will be described in detail later.

The plurality of fluid control devices 40 to 44 include hydraulic two-way valves 40 to 42 positioned on the primary side, and hydraulic three-way valves 43 and 44 positioned on the secondary side.

The two-way valves 40 to 42 are fixed respectively onto the first, second, and fifth to seventh joint blocks 10, 11, and 14 to 16 with bolts 45. The inlet passage and outlet passage in the body of each of the two-way valves 40 to 42 respectively communicate with the flow passages 10a, 11a, 11b, and 14a to 16a of the corresponding first, second, and fifth to seventh joint blocks 10, 11, and 14 to 16.

The three-way valves 43 and 44 are fixed respectively onto the second to fourth and seventh to ninth joint blocks 11 to 13 and 16 to 18 with bolts 45. The inlet passage and outlet passage in the body of each of the three-way valves 43 and 44 respectively communicate with the flow passages 11a to 13a and 16a to 18a of the corresponding second to fourth and seventh to ninth joint blocks 11 to 13 and 16 to 18.

Next, the configuration of the heat transfer cover 30, 30 will be described with reference to FIG. 4A and FIG. 4B to FIG. 6. In this embodiment, there is a heat transfer cover 30 mounted to the first pipe 20, and a heat transfer cover 30 mounted to the fifth pipe 24. Since they have the same configuration, only the heat transfer cover 30 mounted to the first pipe 20 will be described.

Figure 4A:
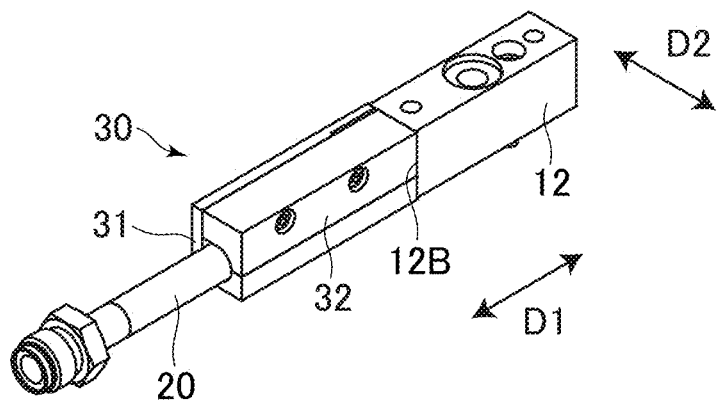
FIG. 4A is a perspective view of a first pipe, a heat transfer cover, and a third joint block.
Figure 4B:
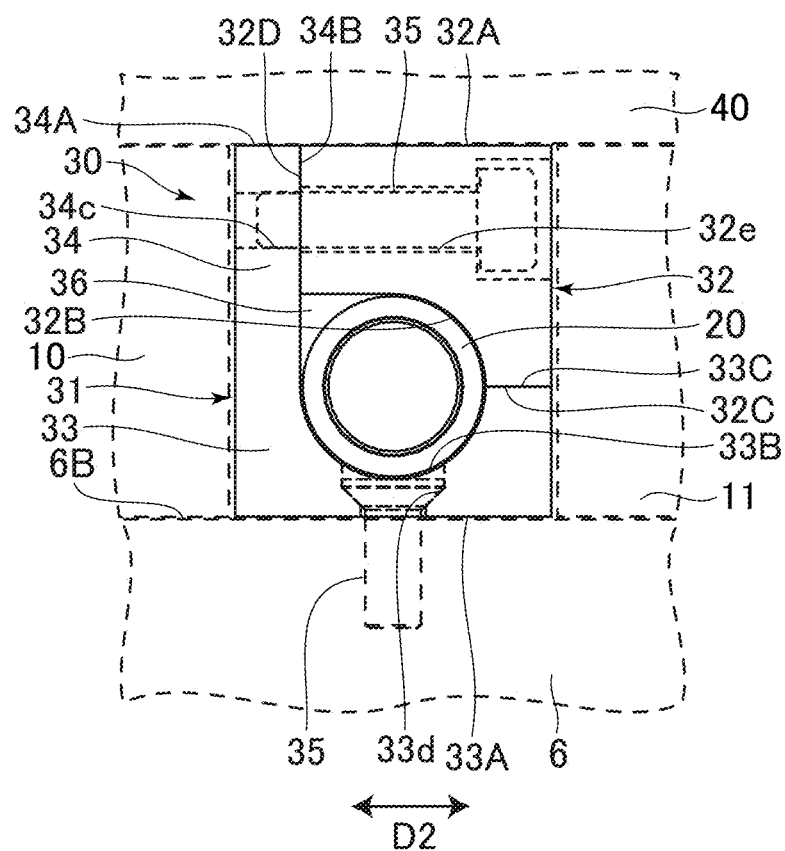
FIG. 4B is a front view of the heat transfer cover.

FIG. 4A is a perspective view of the first pipe 20, heat transfer cover 30, and third joint block 12, and FIG. 4B is a front view of the heat transfer cover 30.

Figure 5:
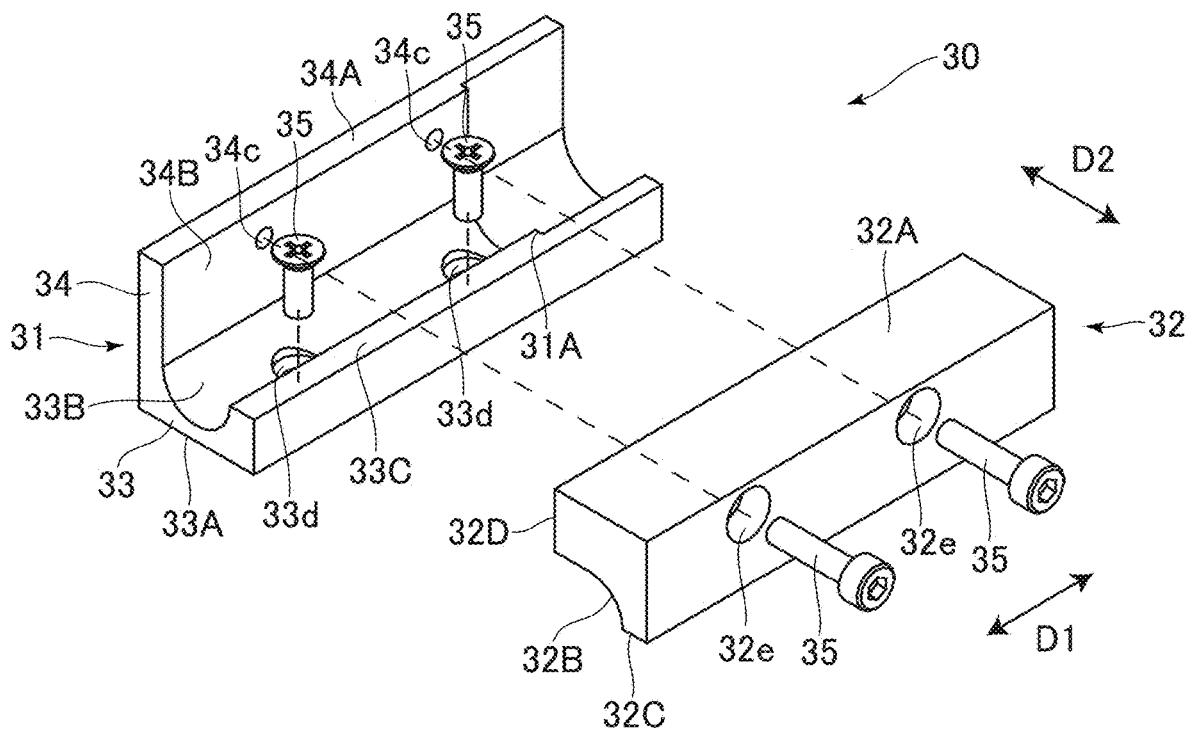
FIG. 5 is an exploded perspective view of the heat transfer cover.

FIG. 5 is an exploded perspective view of the heat transfer cover 30.

Figure 6:
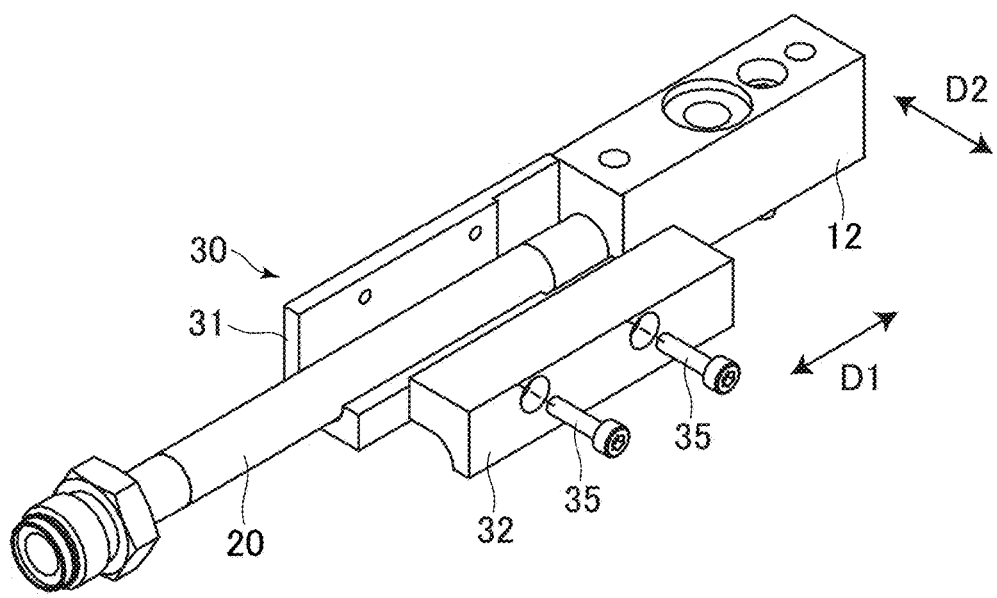
FIG. 6 is an assembly illustration of the heat transfer cover.

FIG. 6 is an assembly illustration of the heat transfer cover 30.

As illustrated in FIG. 4A, FIG. 4B, and FIG. 5, the heat transfer cover 30 includes a first cover member 31, a second cover member 32, and four bolts 35, has a rectangular cross-sectional shape (shape as viewed from front), and extends along the first direction D1. The first cover member 31 and the second cover member 32 are mounted around the outer circumference of the first pipe 20 in contact with each other. The first cover member 31 and the second cover member 32 are made of a metal material or a resin material that has excellent heat conductivity, such as, for example, aluminum alloy.

The first cover member 31 includes, as viewed in cross section, a first portion 33 that covers a part of the first pipe 20 facing the metal plate 6, and a second portion 34 that extends from one end of the first portion 33 on the side facing the first joint block 10 (one side in the second direction D2) to the first fluid control device 40. The first cover member 31 is substantially L-shaped in the cross section.

The first portion 33 has a first abutment surface 33A that abuts on the installation surface 6B of the metal plate 6. The first portion 33 has a first inner circumferential surface 33B that conforms to the outer circumference of the first pipe 20, and a first end face 33C positioned on the side closer to the second joint block 11 (on the other side in the second direction D2) and abutting on the second cover member 32. The first portion 33 is formed with bolt passage holes 33d at two points. The first cover member 31 is fixed to the metal plate 6 by bolts 35 passed through the bolt passage holes 33d.

The second portion 34 has a second end face 34A abutting on the first fluid control device 40 and an inner side face 34B abutting on the second cover member 32. The second portion 34 is formed with bolt thread holes 34c at two points.

The second cover member 32 covers, as viewed in cross section, a part of the first pipe 20 facing the first fluid control device 40, and has a second abutment surface 32A that abuts on the first fluid control device 40. While the second abutment surface 32A is flush with the second end face 34A in this embodiment, the second abutment surface 32A may be protruded toward the first fluid control device 40 more than the second end face 34A. The second cover member 32 has a second inner circumferential surface 32B that conforms to the outer circumference of the first pipe 20, a third end face 32C positioned on the side facing the second joint block 11 and abutting on the first end face 33C, and a fourth end face 32D abutting on the inner side face 34B.

The second cover member 32 is formed with bolt passage holes 32e extending through the second cover member 32 from the side facing the second joint block 11 at two points. The second cover member 32 is fixed to the first cover member 31 by bolts 35 passed through the bolt passage holes 32e and threaded into the bolt thread holes 34c. The first cover member 31 and the second cover member 32 each have a stepped portion 31A (the stepped portion of the second cover member 32 is not shown) on their inner faces on the side facing the third joint block 12, and these stepped portions 31A make the internal space, formed by the first cover member 31 and the second cover member 32, wider.

To assemble the first pipe 20, heat transfer cover 30, and third joint block 12, first, the bolts 35 are passed through the bolt passage holes 33d in a direction orthogonal to the installation surface 6B to fix the first cover member 31 to the metal plate 6.

Next, the first pipe 20 and third joint block 12 that have been united are set such that part of the first pipe 20 is placed on the first cover member 31, and the third joint block 12 is fixed to the metal plate 6. As illustrated in FIG. 6, the bolts 35 are passed through the second cover member 32 along the second direction D2 to fix the second cover member 32 to the first cover member 31. The first pipe 20, the heat transfer cover 30, and third joint block 12 are assembled together this way.

While there is formed a space 36 between the first cover member 31, the second cover member 32, and the first pipe 20 as illustrated in FIG. 4B in this embodiment, the second cover member 32 may be partly protruded to the space 36 so that there is no such space 36.

In the fluid control apparatus 1 of this embodiment, with the two-way valve 40 open, the two-way valve 41 closed, and the three-way valve 43 set such that the flow passage 11a in the second joint block 11 communicates with the flow passage 13a in the fourth joint block 13, the fluid that flows into the second pipe 21 flows to the sixth pipe 25 via the first, second, and fourth joint blocks 10, 11, and 13. With the two-way valve 40 closed, the two-way valve 41 closed, and the three-way valve 43 set such that the flow passage 12a in the third joint block 12 communicates with the flow passage 13a in the fourth joint block 13, the fluid that flows into the first pipe 20 flows to the sixth pipe 25 via the third and fourth joint blocks 12 and 13. With the two-way valve 40 closed, the two-way valve 41 open, and the three-way valve 43 set such that the flow passage 11a in the second joint block 11 communicates with the flow passage 13a in the fourth joint block 13, the fluid that flows into the third pipe 22 flows to the sixth pipe 25 via the fifth, second, and fourth joint blocks 14, 11, and 13.

With the two-way valve 42 open and the three-way valve 44 set such that the flow passage 16a in the seventh joint block 16 communicates with the flow passage 18a in the ninth joint block 18, the fluid that flows into the fourth pipe 23 flows to the seventh pipe 26 via the sixth, seventh, and ninth joint blocks 16, 17, and 19. With the two-way valve 42 closed and the three-way valve 44 set such that the flow passage 17a in the eighth joint block 17 communicates with the flow passage 18a in the ninth joint block 18, the fluid that flows into the fifth pipe 24 flows to the seventh pipe 26 via the eighth and ninth joint blocks 17 and 18.

In the fluid control apparatus 1 described above, the heat transfer cover 30 has a rectangular cross-sectional shape, extends along the first direction D1, and has the first cover member 31 and second cover member 32 mounted around the outer circumference of the first pipe 20 in contact with each other. The first cover member 31 covers a part in a cross section of the first pipe 20 and has a first abutment surface 33A that abuts on the installation surface 6B of the metal plate 6. The second cover member 32 covers another part in a cross section of the first pipe 20 and has a second abutment surface 32A that abuts on the two-way valve 40. This configuration allows for reliable heat transfer from the metal plate 6 to the first pipe 20 and two-way valve 40. Thus, the fluid can be provided to the secondary side at a predetermined temperature.

The first cover member 31 includes, as viewed in cross section, a first portion 33 that covers a part of the first pipe 20 facing the metal plate 6, and a second portion 34 that extends from one end of the first portion 33 on one side in the second direction D2 to the two-way valve 40. The second cover member 32 covers, as viewed in cross section, a part of the first pipe 20 facing the two-way valve 40, and abuts on an end portion of the first portion 33 on the other side in the direction parallel to the installation surface 6B and orthogonal to a predetermined direction, and on the second portion 34. This configuration allows the outer circumference of the first pipe 20 to be covered by the first cover member 31 and second cover member 32, so that the heat from the metal plate 6 can reliably be transferred to the first pipe 20 and two-way valve 40.

The second cover member 32 is fixed to the first cover member 31 with bolts 35 passed through the second cover member 32 from the other side in the second direction D2, which makes it possible to fix the second cover member 32 to the first cover member 31, even though the heat transfer cover 30 has a small width. Thus, the fluid control apparatus 1 can be made smaller.

Figure 7:
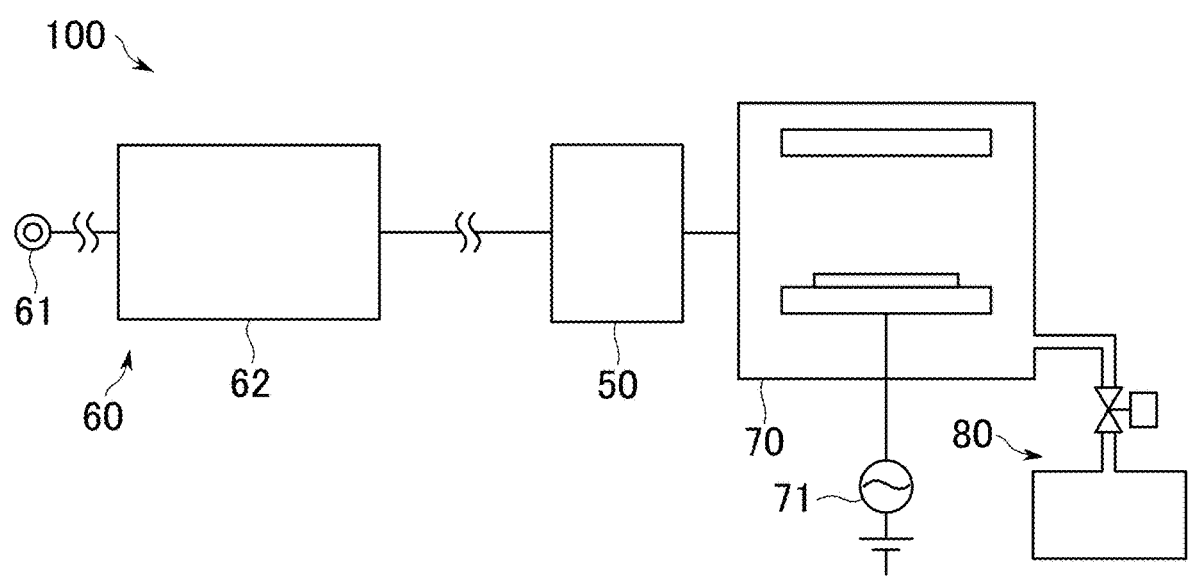
FIG. 7 is a schematic diagram of a semiconductor manufacturing apparatus.

FIG. 7 illustrates a schematic diagram of a semiconductor manufacturing apparatus 100 including a final valve 50 that serves as the fluid control apparatus of this embodiment.

The semiconductor manufacturing apparatus 100 is a CVD apparatus, for example, which forms a passive film (oxide film) on wafers, and includes a gas supply unit 60, the final valve 50, a vacuum chamber 70, and an exhaust unit 80.

The gas supply unit 60 includes a gas supply source 61 and a fluid control apparatus 62. The final valve 50 is provided between the gas supply unit 60 and the vacuum chamber 70. Preferably, the final valve 50 is mounted to a housing close to the vacuum chamber 70. A fluid from the gas supply unit 60 is delivered to the vacuum chamber 70 via the final valve 50.

The present disclosure is not limited to the embodiment described above. A person skilled in the art could make various additions and modifications within the scope of the present disclosure.

What is claimed is:

1. A fluid control apparatus comprising:
a metal plate;
a heater configured to heat the metal plate;
a first joint block and a second joint block provided on an installation surface of the metal plate, extending in a predetermined direction, and formed with a flow passage therein;
a first pipe extending along the predetermined direction between the first joint block and the second joint block;
a heat transfer cover provided on the installation surface of the metal plate; and
a first fluid controller mounted to the first joint block and the second joint block so as to straddle over the first pipe, wherein
the heat transfer cover has a rectangular cross-sectional shape, extends along the predetermined direction, and includes a first cover member and a second cover member mounted around an outer circumference of the first pipe in contact with each other,
the first cover member covers a part of the first pipe in a cross section of the first pipe and has a first abutment surface abutting on the installation surface of the metal plate,
the first abutment surface abutting on the installation surface of the metal plate defines an entirety of a surface of the heat transfer cover on which the metal plate is directly disposed, and
the second cover member covers another part of the first pipe in the cross section of the first pipe and has a second abutment surface abutting on the first fluid controller.

2. The fluid control apparatus according to claim 1, further comprising:
a second pipe and a third pipe;
a third joint block and a fourth joint block provided on the installation surface of the metal plate, extending in a predetermined direction, and formed with a flow passage therein; and
a second fluid controller, wherein
the second pipe is connected to the first joint block,
the third joint block is connected to one end of the first pipe downstream of a flow of a fluid in the first pipe,
the second joint block extends along a part of the first pipe on the metal plate and along the third joint block,
the fourth joint block is provided on an opposite side of the third joint block from the second joint block,
the third pipe is connected to the fourth joint block, and
the second fluid controller is connected to the second joint block, the third joint block, and the fourth joint block.

3. The fluid control apparatus according to claim 2, wherein the first cover member includes, as viewed in cross section, a first portion that covers a part of the first pipe facing the metal plate, and a second portion that extends from one end of the first portion on a first side of the first portion in a direction parallel to the installation surface and orthogonal to a predetermined direction to the first fluid controller,
the second cover member covers, as viewed in cross section, a part of the first pipe facing the first fluid controller, and abuts on an end portion of the first portion on a second side of the first portion in the direction parallel to the installation surface and orthogonal to a predetermined direction, and
the second side of the first portion is opposite to the first side of the first portion.

4. The fluid control apparatus according to claim 3, wherein the second cover member is fixed to the first cover member with a fixture member that extends through a passage hole formed in the second cover member.

* * * * *